US006211022B1

(12) United States Patent
Lin et al.

(10) Patent No.: US 6,211,022 B1
(45) Date of Patent: *Apr. 3, 2001

(54) FIELD LEAKAGE BY USING A THIN LAYER OF NITRIDE DEPOSITED BY CHEMICAL VAPOR DEPOSITION

(75) Inventors: Jonathan Lin, Milpitas; Radu Barsan, Saratoga; Sunil Mehta, San Jose, all of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,265

(22) Filed: Feb. 1, 1999

Related U.S. Application Data

(62) Division of application No. 08/978,754, filed on Nov. 26, 1997.

(51) Int. Cl.$^7$ .................................................. H01L 21/336

(52) U.S. Cl. ................ 438/297; 438/362; 438/439; 257/506; 257/510; 257/640; 257/647; 257/649

(58) Field of Search ....................... 438/297, 305, 438/439, 362; 257/640, 647, 649, 506, 510, 387

(56) References Cited

U.S. PATENT DOCUMENTS

| | | | |
|---|---|---|---|
| 4,782,037 | * 11/1988 | Tomozawa et al. | 257/640 |
| 5,159,353 | * 10/1992 | Fasan et al. | 346/140 |
| 5,821,153 | * 10/1998 | Tsai et al. | 438/439 |
| 5,858,830 | * 1/1999 | Yoo et al. | 438/241 |
| 5,895,243 | * 4/1999 | Doan et al. | 438/297 |
| 5,908,308 | * 6/1999 | Barsan et al. | 438/225 |
| 5,939,761 | * 8/1999 | Dennison et al. | 257/387 |

OTHER PUBLICATIONS

Stanley Wolf Silicon Processing for the VSLI Era vol. 2 Lattice Press p. 18, 1990.*

* cited by examiner

*Primary Examiner*—Charles Bowers
*Assistant Examiner*—David S Blum
(74) *Attorney, Agent, or Firm*—Fliesler, Dubb, Meyer & Lovejoy

(57) ABSTRACT

A nitride layer is deposited over a field oxide layer used to separate transistors formed in a substrate, the nitride layer serving to decrease transistor current leakage. The nitride layer has a dense lattice, effectively blocking H+ and Na+ penetration from overlying layers into the field oxide. Positive ions such as H+ and Na+ penetrating into the field oxide layer cause a p-substrate under the field oxide layer to become inverted or act like an n-type substrate, creating leakage current between source and drain regions of transistors which the field oxide layer separates. When high transistor threshold voltages such as 12 volts or more are desired, the nitride layer provides a significant reduction in current leakage.

6 Claims, 2 Drawing Sheets

FIELD LEAKAGE BY USING A THIN LAYER OF NITRIDE DEPOSITED BY CHEMICAL VAPOR DEPOSITION

This application is a Division of U.S. patent application Ser. No. 08/978,754, filed Nov. 26, 1997, now a Continued Prosecution Application.

BACKGROUND OF THE INVENTION

1. Field of the Invention

The present invention relates to materials and methods used in the manufacture of a semiconductor device which includes an array of transistors to decrease current leakage to achieve better isolation between transistors.

2. Description of the Related Art

FIG. 1 shows a cross section of two NMOS transistors illustrating the typical configuration of materials used in the manufacture of a semiconductor device containing an array of transistors. The transistors are shown formed in a p-type silicon substrate 2. A first transistor 4 includes n-type source and drain implant regions 6 and 8 provided in the substrate 2. A polysilicon gate region 10 of the first transistor 4 is provided bridging the source 6 and drain 8 regions. The polysilicon gate region 10 is separated from the substrate 2 by a dielectric 22. A second transistor 14 includes n-type source and drain implant regions 16 and 18 provided in the substrate 2. A polysilicon gate region 20 of the second transistor 14 bridges the source and drain regions 16 and 18.

A field oxide region 24 is provided in the substrate 2 separating region 8 of the first transistor 4 and region 16 of the second transistor 14. The field oxide region 24 is provided to prevent field leakage between region 8 of the first transistor 4 and region 16 of the second transistor 14. A polysilicon layer 26 overlies at least a portion of the field oxide region 24. The polysilicon region 26 extends to serve as the gate region for other transistors (not shown) in the array, as do polysilicon regions 10 and 20.

A dielectric region 22 surrounds at least a portion of the polysilicon gate regions 10 and 20 and overlies the polysilicon region 26. The dielectric layer 22 can be composed of silicon dioxide, phosphorous silicate glass (PSG), tetraethyl orthosilicate (TEOS), borophosphorous tetraethyl orthosilicate (BPTEOS), or a combination of these materials. Although not shown, other layers of materials are applied above the dielectric layer 22 to complete fabrication of the array of transistors. For example, a metal layer can be provided above the dielectric layer 22 to provide an electrical connection to polysilicon gate regions 10, 20 and 26.

The threshold of a transistor, or gate to source voltage required to turn on the transistor, can be controlled by increasing the distance between the source and drain regions. When a high threshold for a transistor is desired, such as 12 volts or higher, leakage current beneath the field oxide region separating two transistors can significantly affect how wide the separation between source and drain regions of a transistor needs to be for a desired threshold. To prevent increased separation between source and drain regions of a transistor with leakage current beneath the field oxide region, the width of the field oxide region separating source and drain regions of two transistors can be increased.

Current leakage beneath the field oxide region can result when $H^+$ or $Na^+$ ions from layers deposited above the field oxide region penetrate into the field oxide region. The H+ or Na+ ions in the field oxide layer cause a migration of ions from the p-substrate underlying the field oxide region so that the p-substrate inverts and effectively acts like an n-type substrate. With inversion of the p-substrate beneath the field oxide region, significant current leakage between source and gate regions, such as regions 8 and 16 of FIG. 1, can result.

For a large array of transistors where it is typically desirable to increase the density of transistors in a given area, increasing the distance between source and drain regions of transistors, or increasing the width of the field oxide regions to overcome the effects of current leakage beneath the field oxide region is undesirable. Further, when high threshold voltages are desired, charge pump circuitry is typically used to pump voltage above a 5V Vcc input pin to 12 volts or higher to turn on particular transistors. With significant current leakage, charge pump circuitry provided on the chip must be increased in size to supply necessary voltages.

It is, thus, desirable to take steps to reduce leakage current beneath the field oxide region separating transistors in an array.

SUMMARY OF THE INVENTION

The present invention includes a nitride layer deposited over the field oxide region separating transistors in an array to reduce field leakage current. The nitride layer has a dense lattice, effectively blocking H+ and Na+ penetration from overlying layers into the field oxide. With ions such as H+ and Na+ not penetrating into the field oxide layer to cause the underlying p-substrate to become inverted and act like an n-type substrate, leakage current between source and drain regions of transistors separated by the field oxide layer is reduced. With such a nitride layer, transistors can be created with a desired threshold while maintaining a limited distance between source and drain regions of the transistor and a limited field oxide layer width.

BRIEF DESCRIPTION OF THE DRAWINGS

Further details of the present invention are explained with the help of the attached drawings in which.

DETAILED DESCRIPTION

Figure 1:
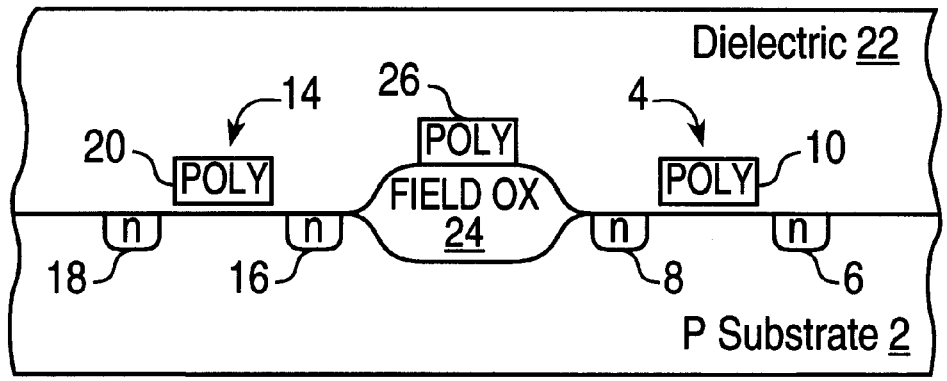
FIG. 1 shows a cross section of two transistors of the prior art illustrating the typical configuration of materials used in the manufacture of an array of transistors.
Figure 2:
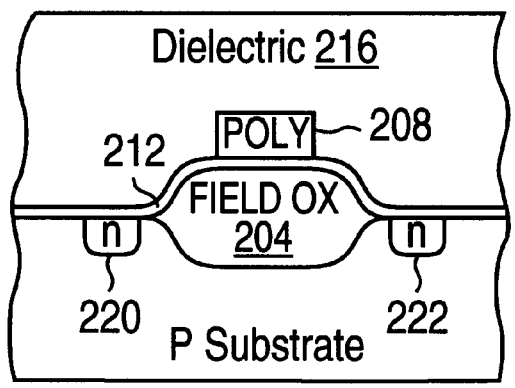
FIG. 2 shows a cross section of a portion of a transistor array showing a nitride layer of the present invention.

FIG. 2 shows a cross section of a portion of a transistor array showing a nitride layer of the present invention as used to reduce field leakage current. In FIG. 2, the nitride layer 212 is shown deposited above the field oxide region 204 which separates two transistors, a first one of the transistors having a source or drain region 220, and a second one of the transistors having a source or drain region 222. The nitride layer further overlies a polysilicon gate 208 overlying the field oxide layer 204. On top of the nitride layer 212, a layer of dielectric material 216, such as TEOS or other dielectric material is deposited.

The nitride layer of the invention includes any type of nitride which acts as a dielectric. An example of such a dielectric nitride is silicon nitride. However, other types of dielectric nitrides known in the art can be used according to this invention.

Chemical vapor deposition (CVD) is used as a process to deposit the nitride layer. The nitride layer thickness can range from about 100 Å to about 250 Å, and preferably from about 150 Å to about 200 Å, or more preferably about 180 Å in thickness.

The nitride layer can cover the entire semiconductor device, or it can be selectively deposited or etched to provide selective nitride coverage.

With transistors separated by a field oxide region without an overlying nitride layer having a threshold voltage set to approximately 12 volts, transistors separated by a field oxide region with an overlying nitride layer can have a threshold increasing to 15 volts without increasing transistor source and drain separation and without increasing the width of the field oxide region. With the nitride layer, a 100-fold reduction in leakage current can be provided.

Figure 3:
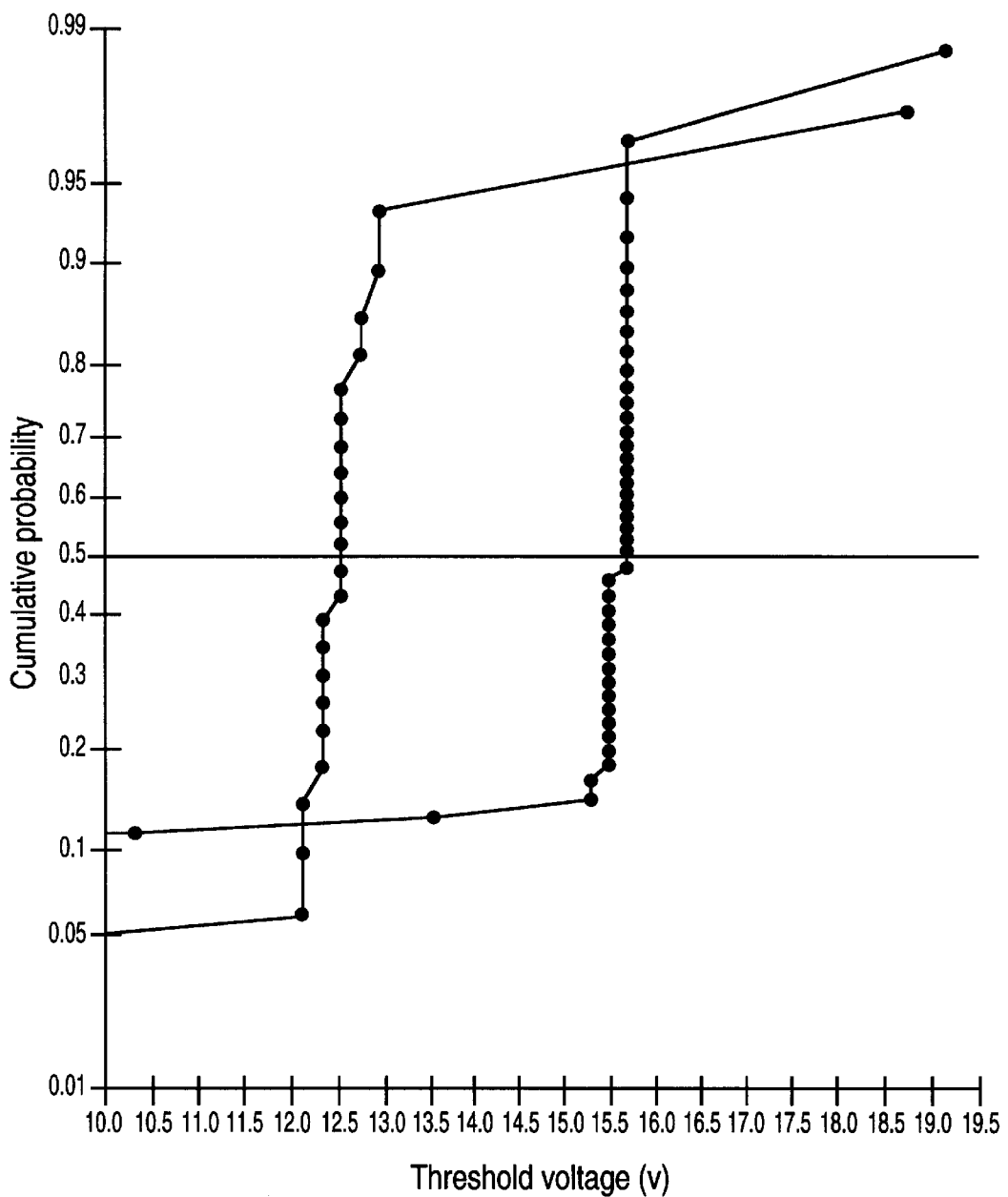
FIG. 3 shows data from experiments comparing the threshold voltage of a conventional transistor and a transistor manufactured with the nitride layer to increase threshold voltage.

FIG. 3 shows the threshold voltage of a field effect transistors for current leakage plotted against the cumulative probability of the value of the threshold for transistors with and without a layer. A cumulative probability of 0.5 represents the mean value of the data, and the negative and positive 95% confidence limits are represented by the 0.05 and 0.95 points, respectively.

Transistors without the CVD nitride layer (O) showed consistent voltages of around 12.5 volts to threshold, with the 95% confidence limits of about ±1V. In contrast, the transistors with the CVD nitride layer (●) had a threshold voltage of about 15.5 volts, with a 95% confidence limit of about 0.5 V. Thus, the increase in threshold voltage was about 3 V, which represents about a 100-fold decrease in current leakage.

Nitride is known to have a denser lattice structure, and one possible theory to account for the efficacy of the nitride layer in decreasing current leakage is that the layer can effectively block the $H^+$ and $Na^+$ from penetrating into the field oxide layer from the dielectric layer above, thereby preventing device degradation due to charge infiltration into the field oxide layer. However, other theories may explain the phenomenon and the invention does not rely upon any particular theory for its operability.

Although the invention has been described above with particularity, this was merely to teach one of ordinary skill in the art how to make and use the invention. Many modifications will fall within the scope of the invention, as that scope is defined by the claims which follow.

What is claimed is:

1. A method of manufacturing integrated circuits comprising the steps of:

creating source and drain regions for a first transistor;

creating source and drain regions for a second transistor;

creating a field oxide between the first transistor and the second transistor;

forming a polysilicon gate having a top portion on at least one of said first or second transistors; and applying a layer of nitride having a thickness of between about 100 Å and about 250 Å directly over and in contact with said top portion of the polysilicon gate and field oxide layers.

2. The method of claim 1 further comprising the steps of:

depositing a polysilicon region above the field oxide layer prior to depositing the nitride layer; and applying a layer of dielectric material above the nitride layer.

3. The method of claim 1 further comprising the step of:

depositing the nitride layer using chemical vapor deposition.

4. The method of claim 1 wherein the source and drain regions of the first and second transistors are n-type implant regions.

5. The method of claim 1 wherein the thickness of the nitride layer is between about 150 Å and about 200 Å.

6. The method of claim 1 wherein the thickness of the nitride layer is about 180 Å.

* * * * *

UNITED STATES PATENT AND TRADEMARK OFFICE
CERTIFICATE OF CORRECTION

PATENT NO. : 6,211,022 B1
DATED : April 3, 2001
INVENTOR(S) : Lin et al.

It is certified that error appears in the above-identified patent and that said Letters Patent is hereby corrected as shown below:

Title page,
Title,
Item [54], please insert the word "Improving" before the word "Field" so that the title reads as "Improving Field Leakage by Using a Thin Layer of Nitride Deposited by Chemical Vapor Deposition".

Signed and Sealed this

Twenty-seventh Day of November, 2001

Attest:

*Nicholas P. Godici*

NICHOLAS P. GODICI
*Attesting Officer*   *Acting Director of the United States Patent and Trademark Office*